United States Patent [19]
Ravid et al.

[11] Patent Number: 5,281,928
[45] Date of Patent: Jan. 25, 1994

[54] ELECTRONIC ATTENUATOR

[75] Inventors: Shmuel Ravid, Newton; Alan R. Olsen, Saugus; Gary E. St. Onge, Chelmsford, all of Mass.

[73] Assignee: M/A-Com, Inc., Burlington, Mass.

[21] Appl. No.: 966,305

[22] Filed: Oct. 26, 1992

[51] Int. Cl.⁵ .............................................. H03H 7/25
[52] U.S. Cl. .................................. 333/81 R; 307/264; 307/568
[58] Field of Search ........................... 333/81 R, 81 A; 307/264, 490, 568

[56] References Cited

U.S. PATENT DOCUMENTS

| | | | |
|---|---|---|---|
| 4,438,415 | 3/1984 | Hopfer | 333/81 A |
| 4,683,386 | 7/1987 | Kamikawara | 307/549 |
| 4,996,504 | 2/1991 | Huber et al. | 333/81 R |
| 5,001,524 | 3/1991 | Golio et al. | 357/22 |
| 5,049,841 | 9/1991 | Cooper et al. | 333/81 R |
| 5,157,323 | 10/1992 | Ali et al. | 333/81 R X |

FOREIGN PATENT DOCUMENTS

| | | | |
|---|---|---|---|
| 148706 | 7/1985 | European Pat. Off. | 333/81 R |
| 312710 | 12/1988 | Japan | 333/81 R |

OTHER PUBLICATIONS

"An Ultra Broadband DC-12GHz 4-Bit GaAs Monolithic Digital Attenuator" by McGrath et al, GaAs IC Symposium 1991 pp. 247-250.

"DC-20 GHz MMIC Multi-Bit Digital Attenuators with on Chip TTL Control" by Khabbaz et al, pp. 239-242 GaAs IC Symposium 1991.

"Low-Loss High-Power Broadband GaAs MMIC Multi-Bit Digital Attenuators with On-Chip TTL Drivers" GaAs IC Symposium pp. 243-246 1991 by: Fazal Ali et al.

"Using GaAs MMICS as Control devices" by Pengally et al. MSN Apr. 1989 pp. 18-28.

"A 0.05 to 14 GHz MMIC 5-Bit Digital Attenuator" by: Gupta et al pp. 231-234 GaAs IC Symposium 1987.

Primary Examiner—Paul Gensler
Attorney, Agent, or Firm—Hayes, Soloway, Hennessey & Hage

[57] ABSTRACT

An electronic attenuator device is provided whose attenuation characteristics are substantially insensitive to variations in component element parameters and ambient temperature changes. Advantageously, an attenuator device made according to the present invention may be constructed at substantially reduced cost without loss of attenuation precision.

16 Claims, 2 Drawing Sheets

% CHANGE IN RESISTANCE (FROM NOMINAL)

ELECTRONIC ATTENUATOR

BACKGROUND OF THE INVENTION

1. Field of the Invention

This invention relates generally to controllable electronic attenuators, and more specifically, to digitally programmable attenuators or amplitude modulators capable of providing predetermined, selectable, discrete magnitudes of electronic signal attenuation in response to control signals. The invention has particular utility in the area of monolithic microwave application circuitry and will be described in connection with such utility, although other utilities are contemplated.

Present day electronic devices often incorporate controllable attenuator devices and/or components for varying the amount of resistance applied to electronic signals passing therethrough. Such attenuators are used in, inter alia, automatic gain control circuits, position locating systems, telephone systems, television systems, and microwave circuit applications.

Electronically controllable solid state attenuators for use at microwave frequencies sometimes employ PIN diodes arranged in a variety of network configurations. Circuitry for providing controlled bias to the diodes is generally used in such devices to cause the diode network to generate the desired magnitude of signal resistance. Such PIN diode-based attenuators are capable of outstanding high-frequency performance, but consume an undesirably large amount of electrical power, and additionally, are not easily integrated into monolithic microwave-application circuitry.

Other devices for providing selectable attenuation incorporate high frequency field effect transistors (FETs), such as, e.g. gallium arsenide metal semiconductor FETs, arranged in a variety of network configurations (which may include other circuit elements, e.g., discrete resistors, among others). These devices operate by applying control signals to the gates of the transistors to adjust or select the overall attenuation level of the device. The characteristic parameters of the device's individual component elements (for example, the depths of the transistors' undepleted channels and the volume distribution uniformity of the resistors, inter alia, which respectively, determine the transconductance and resistance characteristics of the transistors and resistors) determine the overall attenuation characteristics of the attenuator. Thus, in order to function properly, conventional attenuators must be fabricated with particular attention being paid to precise control of the parameters of the component elements (transistors, resistors, and the like). This precision is difficult to achieve, mainly because element parameters tend to vary with ambient temperature, device age, and, most importantly, manufacturing anomalies.

Conventional manufacturing typically produce device anomalies (some of which have been described above) in which the actual parameters of the device's component elements may vary quite widely and unpredictably from desired, nominal parameters. Usually, the actual parameters are distributed closely around the nominally desired (planned) values, but deviations of ±30% or more from nominal are not uncommon. This phenomenon can have the undesirable consequence that the series arm resistance (at a given current) through a given bit-branch of the attenuator may be higher than nominally expected while the shunt arm resistance thereof may be lower than nominal. This disadvantageously may cause the actual magnitudes of attenuation of a particular attenuator device to vary unpredictably from those expected. This effect may be exacerbated by ambient temperature change.

Conventional methods for mitigating the aforementioned problems (resulting from manufacturing process anomalies) involve the use of high precision (low tolerance) component elements and/or pre-tested component elements. The latter technique essentially involves careful prior examination of component elements to ascertain the elements' characteristics, and then, to incorporate into the attenuator only those elements having exactly the desired characteristics. Unfortunately, implementation of the aforesaid techniques is quite costly, and therefore, can add greatly to overall fabrication costs of the conventional attenuator device.

Examples of conventional attenuator devices are disclosed in: Hopfer, U.S. Pat. No. 4,438,415 (1984); Kamikawara, U.S. Pat. No. 4,683,386 (1987); Golio et al, U.S. Pat. No. 5,001,524 (1991); Cooper et al, U.S. Pat. No. 5,049,841; McGrath and Pratt, "An Ultra Broad Band DC-12 GHz 4-Bit Gallium Arsenide Monolithic Digital Attenuator," *Gallium Arsenide IC Symposium Digest*, (March 1991), pp 247–250; Khabbaz et al, "DC-20 GHz MIMIC Multi-Bit Digital Attenuators With On-Chip TTL Control," *13th Annual Gallium Arsenide IC Symposium Technical Digest* 1991, pp. 239–242; Ali et al, "Low-loss, High-power, Broad Band Gallium Arsenide MIMIC Multi-Bit Digital Attenuators With On-Chip TTL Drivers," *13th Annual Gallium Arsenide IC Symposium Technical Digest* 1991, pp 243–246; Pengelly, "Using Gallium Arsenide MIMICS as Control Devices," *MSN*, (April 1989), pp 18–28; and, Gupta et al, "A 0.05-to-14-GHz MMIC 5-Bit Digital Attenuator," *Gallium Arsenide IC Symposium* (April 1987), pp 231–234.

OBJECTS OF THE INVENTION

It is therefore a general object of the present invention to provide a digitally-controllable attenuator device for providing different magnitudes of signal attenuation, whose design substantially eliminates the aforesaid disadvantages and drawbacks of the prior art. More specifically, it is an object of the present invention to provide such an attenuator whose actual magnitudes of attenuation may be accurately predicted and predetermined, over a wide range of ambient conditions, while permitting substantial reduction in device fabrication costs.

SUMMARY OF THE INVENTION

The present invention provides an electronic attenuator device for providing different magnitudes of signal attenuation, in response to control signals. Referring to FIG. 1, an attenuator device according to the present invention comprises an input, an output, and first, second, third, and fourth transistors, each of which transistor has a source, gate, and drain. One shunt arm of the attenuator comprises a first shunt resistor from node 56 to node 14, and a first transistor whose drain is node 14 and whose source is connected to ground at node 18. The second shunt arm comprises a sixth resistor from node 54 to node 36 and a second transistor whose drain is connected to node 36 and whose source is connected to ground at node 18. The series arm comprises a second resistor from node 56 to node 58, a fourth transistor whose source is connected to node 58 and whose drain is connected to node 52, and a fifth resistor from node 52 to node 54. The fourth transistor has third and fourth resistors connected from its gate to its source and drain, respectively. A third transistor has its source and drain connected to nodes 56 and 54, respectively. The first control line is connected to the gate of the third transistor; and the second control line is connected to the gates of the first and second transistors.

Also, according to the present invention, the nominal resistance values of the resistors and the nominal transconducting parameters of the transistors (at a given current) are predetermined so as substantially to satisfy the equation: $(R_2+R_5) R_{Q1} = R_1 R_{Q4}$, wherein the variables $R_1$, $R_2$, $R_5$, $R_{Q1}$, and $R_{Q4}$ are the nominal resistance values of the first, second, and fifth resistors, and the nominal transconductance of the first and fourth transistors, at the given current, respectively.

Advantageously, this configuration of circuit component elements according to the present invention permits a constant ratio of resistor and transistor resistances (at a given current) to be maintained in both the series and shunt arms of the bit-branches of the attenuator, regardless of deviations in actual resistor and transistor resistances from the nominally expected values. Furthermore, this configuration offers significantly improved attenuation stability during periods of ambient temperature change. Advantageously, therefore, the present invention permits construction of an attenuator whose attenuation characteristics may accurately be predicted and predetermined without the need to perform expensive and time-wasting component pre-testing, and without costly low-tolerance component elements.

Other features and advantages of the present invention will become apparent as the following description precedes and upon reference to the drawings, wherein like numerals depict like parts and in which:

While the present invention will hereinafter be described in connection with preferred embodiments thereof, it will be understood that it is not intended to limit the invention to these embodiments. On the contrary, it is intended to cover all alternatives, modifications, and equivalents as may be included within the spirit and broad scope of the invention as defined only by the appended claims.

DETAILED DESCRIPTION OF PREFERRED EMBODIMENTS

Figure 1:
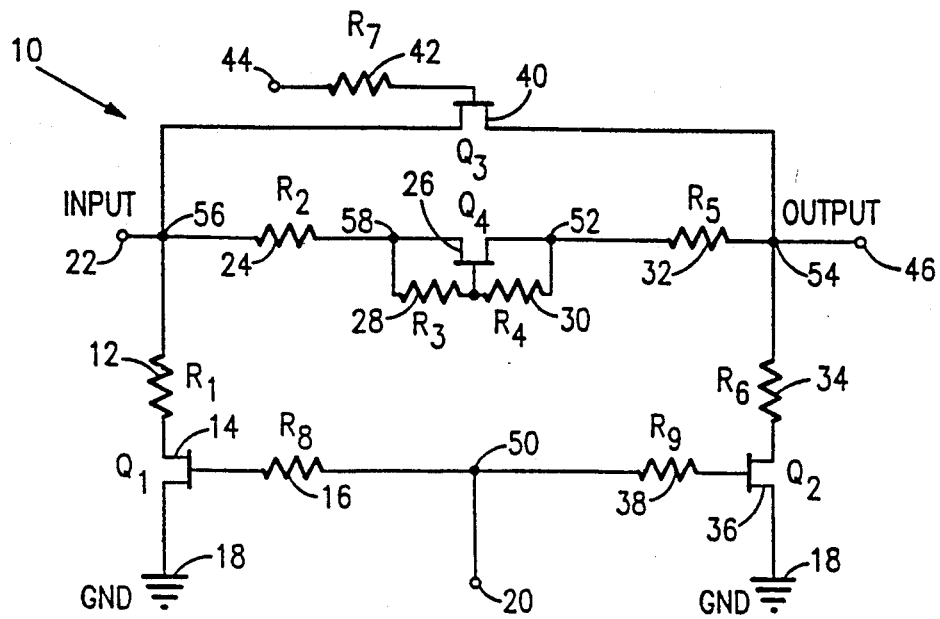
FIG. 1 is a schematic circuit diagram of one preferred embodiment of an attenuator device made according to the present invention.

FIG. 1 is a schematic circuit diagram of a first preferred embodiment 10 of an attenuator device made according to the present invention. Radio frequency and/or microwave signals to be attenuated are applied to input pad/terminal 22 for transmission to the device 10. The input 22 is electrically connected, through a common node 56, to a first resistor 12, a second resistor 24, and the source of a third transistor 40. The third transistor 40, in turn, has its drain connected via a second common node 54 to an output 46 (for transmitting the attenuated signal from the device 10). The first resistor 12 is also connected to the drain of the first transistor 14 and the second resistor 24 is connected to a third common node 58, to which is also connected the source of a fourth transistor 26 and a third resistor 28. The gate of the fourth transistor is connected, in parallel, to the third resistor and a fourth resistor 30, which is also connected via a fourth common node 52 to the drain of the fourth transistor 26 and a fifth resistor 32. The fifth resistor is also connected to the second common node 54. The drain of the second transistor 36 is also connected to the common node 54 via a sixth resistor 34.

First and second control lines 44 and 20, respectively, are also provided in the device 10. The first control line 44 is connected to the gate of the third transistor 40 while the second control line 20 is connected, in parallel, to the gates of the first 14 and the second 36 transistors, respectively. Depending on the presence or absence of control voltage on the control lines 20 and 44, the amount of attenuation applied to the signal entering the device 10 at input 22 may be selected. The signal thus attenuated exits the device 10 by output 46. Also in this preferred embodiment, a seventh resistor 42 is interposed between the first control line 44 and the gate of the third transistor 40, and eighth 16 and ninth 38 resistors are connected to the second control line 20 via another common node 50. Of course, as will be instantly appreciated by those skilled in the art, the seventh 42, eighth 16, and ninth 38 resistors may be eliminated without departing from the spirit or scope of the present invention. The series arm of the attenuator bit-branch 10 consists of the second and fifth resistors 24 and 32, respectively, and the fourth transistor 26; the shunt arm of the attenuator 10 consists of the first resistor 12 and the first transistor 14.

According to the present invention, the nominal resistance values of the resistors and the nominal transconducting properties (at a given current) of the transistors substantially satisfy the equation:

$$(R_2+R_5) R_{Q1} = R_1 R_{Q4};$$

in which the variables $R_{Q1}$ and $R_{Q4}$ represent the nominal resistance of the first and fourth transistors at a given current (typically, 10 mA), respectively, and $R_1$, $R_2$, and $R_5$, present the nominal resistance values of the first 12, second 24, and fifth 32 resistors, respectively. By choosing these values so as substantially to satisfy the aforesaid equation, a constant ratio (in both the series and shunt arms of each bit-branch 10) of actual transistor "on" state resistance and resistor resistance may be maintained.

Also in this preferred embodiment 10, the nominal transconducting properties (at a given current, typically 10 mA) of the transistors 14, 36, 26, 40 are chosen so as to be substantially identical to one other, however, identicality of transconducting properties need not exist for a device 10 to remain within the spirit and scope of the present invention, so long as the transconductance properties of the transistors are chosen so that the aforesaid equation is substantially satisfied. In like manner, and within the same constraints, although the resistors 28, 30, 34, 42, 16, 38, preferably have predetermined nominal resistance values $R_3$, $R_4$, $R_6$, $R_7$, $R_8$, $R_9$, respectively, this need not be the case. However, in this preferred embodiment, the nominal resistance value $R_3$ of the third transistor 28 is chosen so as to be substantially equal to the nominal resistance value $R_4$ of the fourth resistor 30 (which is preferably between 50 and 5K ohms); the nominal resistance value of $R_5$ of the fifth resistor 32 is substantially identical to that $R_2$ of the second resistor 24; the nominal resistance value $R_6$ of the sixth resistor 34 is substantially identical to that $R_1$ of the first resistor 12; and, the nominal resistance values $R_7$, $R_8$, $R_9$, of the seventh 42, eighth 16, and ninth 38 resistors, respectively, are substantially identical (and preferably are within the range of between 1K and 10K ohms).

Figure 2:
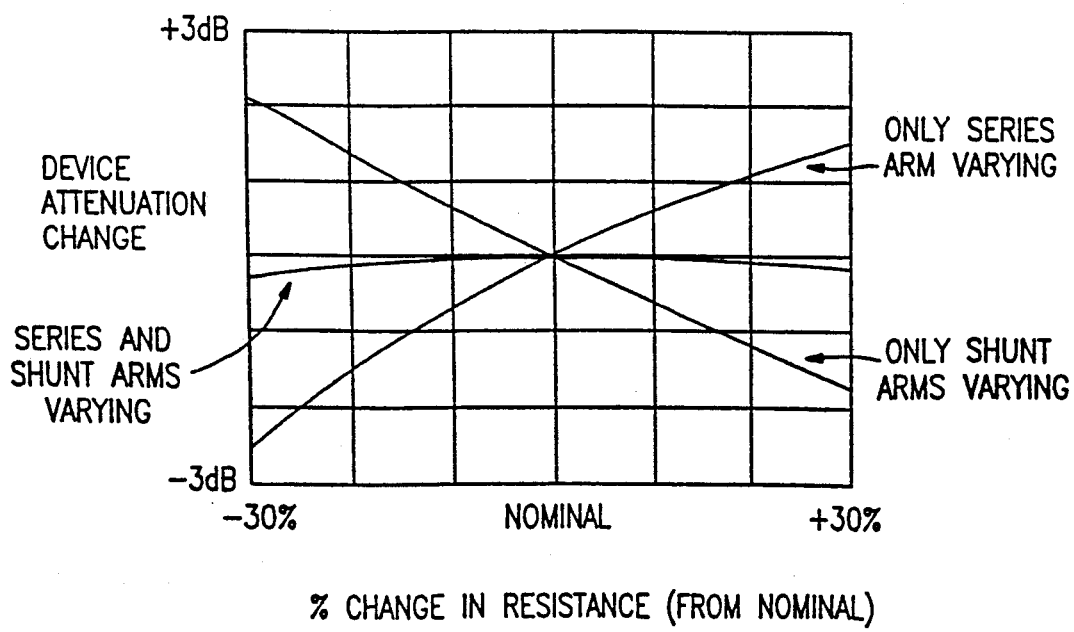
FIG. 2 is a graphical depiction of attenuation magnitude variation (gain change) of the preferred embodiment depicted in FIG. 1, resulting when the actual resistance values of the resistors are allowed to vary between ±30% of nominal.

In order to illustrate the improved attenuation predictability of a digital attenuator made according to the present invention, a computer simulated analysis of gain error of the preferred embodiment shown in FIG. 1 was conducted. The actual resistance values of the resistors in the device 10 as a whole, and the series and shunt arms thereof, were allowed to vary between ±30% of the nominally chosen values. Attenuation change (gain error) data from this analysis is graphically shown in FIG. 2, which illustrates that the gain error which may result from variations in actual resistor values is insubstantial in a device 10 made according to the present invention, and that such a device 10 exhibits substantially predicted attenuation characteristics despite significant variations in nominal component parameters. Additionally, it has been found that an attenuator made according to the present invention exhibits excellent broad-band, high frequency characteristics over a wide range of temperatures. Finally, the present invention permits an extremely precise and versatile digital attenuator to be fabricated at greatly reduced cost (in some cases, at a cost reduction of a factor of fifty over the prior art), that heretofore was not possible according to the prior art.

Figure 3:
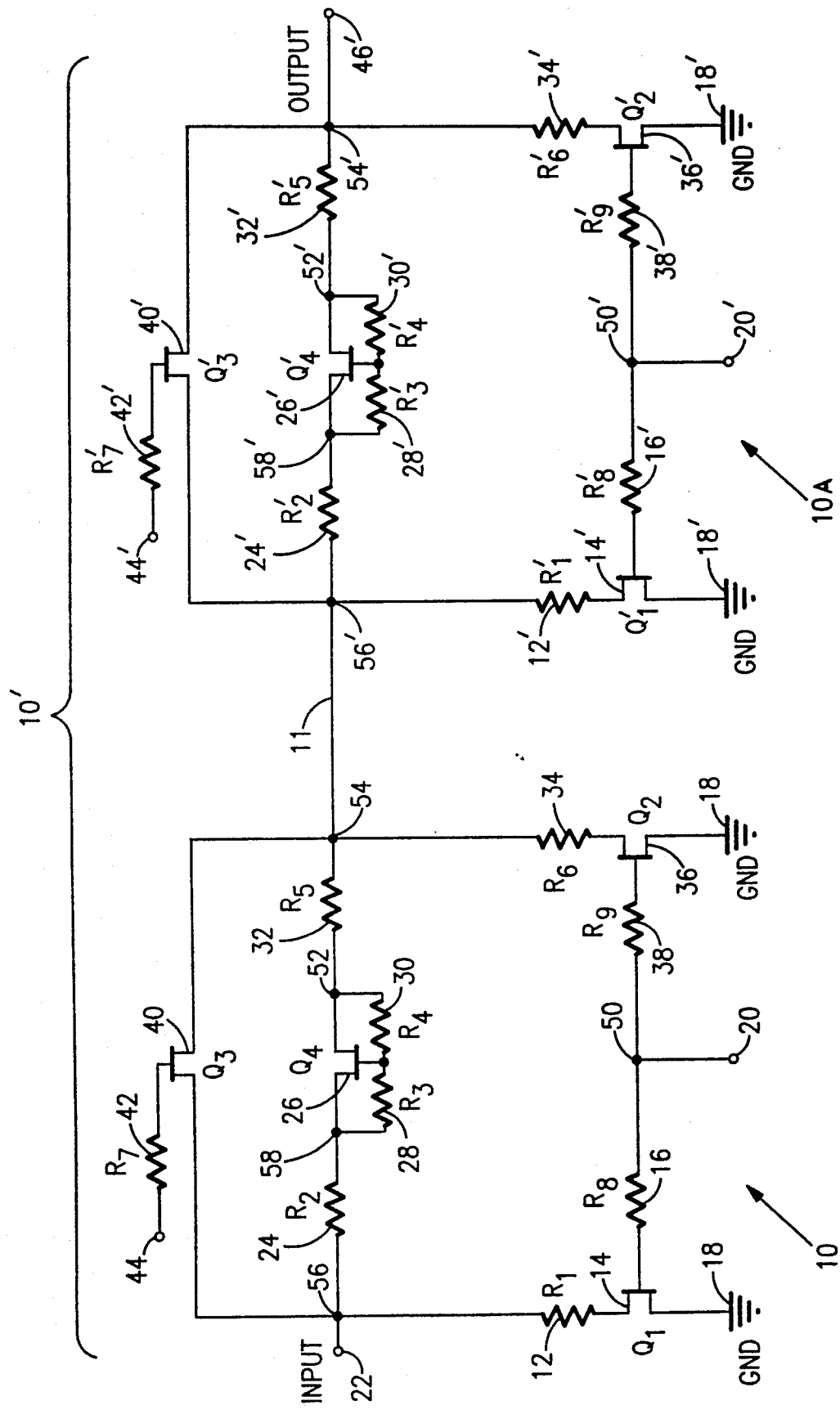
FIG. 3 is a schematic circuit diagram of another preferred embodiment of an attenuator device made according to the present invention.

Thus, it is evident that there has been provided, in accordance with the present invention, an improved digital attenuator device. While the invention has been described in conjunction with specific embodiments thereof, many alternatives, modifications, and variations may be made without departing from the spirit and scope of the invention. For example, rather than using metal oxide semiconductor (MOS) transistors, an attenuator device according to the present invention may instead incorporate metal semi-conductor field effect transistors. Additionally, the connections made to the sources and drains of the transistors comprising the attenuator of the present invention may be reversed; that is, a connection made to the source of a transistor may rather be made to its drain and vice versa, without departing from the spirit or scope of the present invention. Also, as is shown in FIG. 3, two of the preferred embodiments 10 shown in FIG. 1 may be cascaded together to form an attenuator 10' offering additional levels of selectable input signal attenuation. In the embodiment 10' illustrated in FIG. 3, elements similar to those of the embodiment 10 of FIG. 1 are represented by like numerals, with the exception that numerals representing the elements of the second half of the embodiment 10' are primed, and the two cascaded stages 10, 10A are connected by connection 11. In like manner, any number of such preferred embodiments 10 depicted in FIG. 1 may be cascaded so as to form a digital attenuator having any number of attenuation levels without departing from the present invention. Yet other variations are possible without departing from the spirit or scope of the present invention. Accordingly, the present invention is intended to embrace all such alternatives, modifications, and variations as may fall within the spirit and broad scope of the hereinafter appended claims.

What is claimed is:

1. An electronic device for providing different magnitudes of signal attenuation in response to control signals, and comprising, an input, an output, first, second, third, and fourth transistors, each said transistor respectively having a source, gate, and drain, the sources of said first and second transistors being connected to a reference potential, said input being commoned with a first resistor, a second resistor, and the source of said third transistor, said first resistor being serially connected to the drain of said first transistor, said second resistor being connected in parallel to the source of said fourth transistor and a third resistor, said third resistor being connected in parallel to the gate of said fourth transistor and a fourth resistor, said fourth resistor being connected in parallel to the drain of said fourth transistor and a fifth resistor, said output being commoned with said fifth resistor, the drain of said third transistor, and a sixth resistor, and first and second control lines, said first control line being connected to the gate of said third transistor, said second control line being connected, in parallel, to each of the gates, respectively, of said first and second transistor, and wherein:

nominal resistance values of said resistors and nominal transconducting properties, at a given current, of said transistors substantially satisfy the equation: $(R_2+R_5) R_{Q1} = R_1 R_{Q4}$, in which the variables $R_1$, $R_2$, $R_5$, $R_{Q1}$, and $R_{Q4}$ are the nominal resistance values of the first, second, and fifth resistors, and the nominal transconductance of the first and fourth transistors, at said given current, respectively.

2. A device according to claim 1, wherein each of said transistors have predetermined transconducting properties at said given current.

3. A device according to claim 2, wherein said first and second transistors have transconducting properties nominally identical to each other at said given current.

4. A device according to claim 1, wherein each said resistors have predetermined nominal resistance values.

5. A device according to claim 4, wherein the nominal resistance value of said fourth resistor is substantially identical to that of said third resistor.

6. A device according to claim 4, wherein the nominal resistance value of said fifth resistor is substantially identical to that of said second resistor.

7. A device according to claim 4, wherein the nominal resistance value of said sixth resistor is substantially identical to that of said first resistor.

8. A device according to claim 4, wherein the nominal resistance values of said third and fourth resistors are within the range of between 50 to 5,000 ohms.

9. An electronic device for providing predetermined, digitally selectable, discrete magnitudes of signal attenuation in response to digital control signals, and comprising, in combination:

a. an input for transmitting a signal to be attenuated to said device;

b. an output for transmitting an attenuated signal from said device;

c. first, second, third, and fourth transistors, each said transistor respectively having a source, gate, and drain, and having predetermined nominal transconducting properties, said first and second transistors having nominal transconducting properties substantially identical to each other;

d. first, second, third, fourth, fifth, sixth, seventh, eighth, and ninth resistors having predetermined nominal resistance values, the nominal resistance values of said third and fourth resistors being substantially identical to each other, the nominal resistance values of said second and fifth resistors being substantially identical to each other, the nominal resistance values of said first and sixth resistors being identical to each other, and the nominal resistance values of said seventh, eighth, and ninth resistors being substantially identical to each other, the sources of said first and second transistors being connected to a reference potential, said input being connected to said first resistor, said second resistor, and the source of said third transistor, said first resistor being serially connected to the drain of said first transistor, said second resistor being connected in parallel to the source of said fourth transistor and said third resistor, said third resistor being connected in parallel to the gate of said fourth transistor and said fourth resistor, said fourth resistor being connected in parallel to the drain of said fourth transistor and said fifth resistor, said output being connected to said fifth resistor, the drain of said third transistor, and said sixth resistor;

e. first and second control lines, said first control line being connected to the gate of said third transistor via said seventh resistor, said second control line being connected, in parallel, to each of the gates, respectively, of said first and second transistors via said eighth and ninth resistors, respectively, and wherein the nominal resistance values of said resistors and the nominal transconducting properties of said transistors, at a given current, substantially satisfy the equation:

$(R_2 + R_5) R_{Q1} = R_1 R_{Q4}$, in which the variables $R_1$, $R_2$, $R_5$, $R_{Q1}$, and $R_{Q4}$ represent the nominal resistance values of the first, second, and fifth resistors, and the nominal transconductance of the first and fourth transistors, at said given current, respectively.

10. A device according to claim 9, wherein the nominal resistance values of said third and fourth resistors are within the range of between 50 to 5,000 ohms.

11. A device according to claim 9, wherein the nominal resistance values of said seventh, eighth, and ninth resistors are nominally identical, and are within the range of between 1,000 and 10,000 ohms.

12. A device according to claim 9, wherein said given current is about 10 mA.

13. An attenuation system comprising a plurality of connected attenuator devices according to claim 1.

14. An attenuation system comprising a plurality of connected attentuator devices according to claim 9.

15. A device according to claim 1, wherein connections made to each said transistor's source and drain are reversed.

16. A device according to claim 9, wherein connections made to each said transistor's source and drain are reversed.

* * * * *